(12) United States Patent
Shimoni

(10) Patent No.: US 8,588,348 B2
(45) Date of Patent: Nov. 19, 2013

(54) RECEIVER WITH AUTOMATIC GAIN CONTROL

(75) Inventor: Eliezer Shimoni, Plano, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 588 days.

(21) Appl. No.: 12/459,995

(22) Filed: Jul. 10, 2009

(65) Prior Publication Data

US 2011/0007780 A1  Jan. 13, 2011

(51) Int. Cl.
H04L 27/08 (2006.01)

(52) U.S. Cl.
USPC ........... 375/345; 375/316; 375/346; 375/354; 455/501; 455/423

(58) Field of Classification Search
USPC .......................... 375/136, 345, 354; 341/139
See application file for complete search history.

(56) References Cited

U.S. PATENT DOCUMENTS

| | | | |
|---|---|---|---|
| 5,630,220 A | 5/1997 | Yano | |
| 5,745,531 A | 4/1998 | Sawahashi et al. | |
| 6,075,978 A | 6/2000 | Tsumura | |
| 6,088,583 A | 7/2000 | Shimizu et al. | |
| 6,172,559 B1 | 1/2001 | Yamaguchi | |
| 6,175,746 B1 | 1/2001 | Nakayama et al. | |
| 6,442,380 B1 | 8/2002 | Mohindra | |
| 6,498,927 B2 | 12/2002 | Kang et al. | |
| 6,510,188 B1 | 1/2003 | Isaksen et al. | |
| 6,625,433 B1 | 9/2003 | Poirier et al. | |
| 6,748,201 B2 | 6/2004 | Black et al. | |
| 6,799,024 B2 | 9/2004 | Wang et al. | |
| 7,268,715 B2 | 9/2007 | Guimaraes | |
| 7,991,087 B2* | 8/2011 | Solum | 375/345 |
| 8,094,764 B2* | 1/2012 | Lackey | 375/354 |
| 2001/0053680 A1 | 12/2001 | Yamanaka et al. | |
| 2002/0163979 A1 | 11/2002 | Takatz et al. | |
| 2003/0025623 A1* | 2/2003 | Brueske et al. | 341/139 |
| 2005/0003783 A1 | 1/2005 | Ben-Ayun et al. | |
| 2005/0047533 A1 | 3/2005 | Ruelke et al. | |
| 2006/0003726 A1 | 1/2006 | Razzell | |
| 2006/0222116 A1 | 10/2006 | Hughes et al. | |
| 2007/0076827 A1 | 4/2007 | Beamish et al. | |
| 2007/0086547 A1* | 4/2007 | Sobchak et al. | 375/345 |
| 2007/0280379 A1* | 12/2007 | Wong et al. | 375/332 |
| 2010/0173599 A1* | 7/2010 | Solum | 455/232.1 |

* cited by examiner

Primary Examiner — Eva Puente

(57) ABSTRACT

An automatic gain control (AGC) system and corresponding method is configured to increase signal to noise which may be referred to as signal to noise ratio in a receiver. The AGC system includes: a signal level detector for determining a signal level for a desired signal; a wideband signal detector for determining a wideband signal level of a wideband signal, the wideband signal being indicative of an interfering signal being present; and a controller coupled to both detectors and configured to provide one or more AGC signals to the receiver to establish a gain setting for the receiver, wherein an initial AGC setting for the receiver is based on the signal level, and AGC adjustments, based e.g., on one or more of the signal level and the wideband signal level, are provided such that an adjusted AGC setting for the receiver increases the signal to noise.

22 Claims, 7 Drawing Sheets

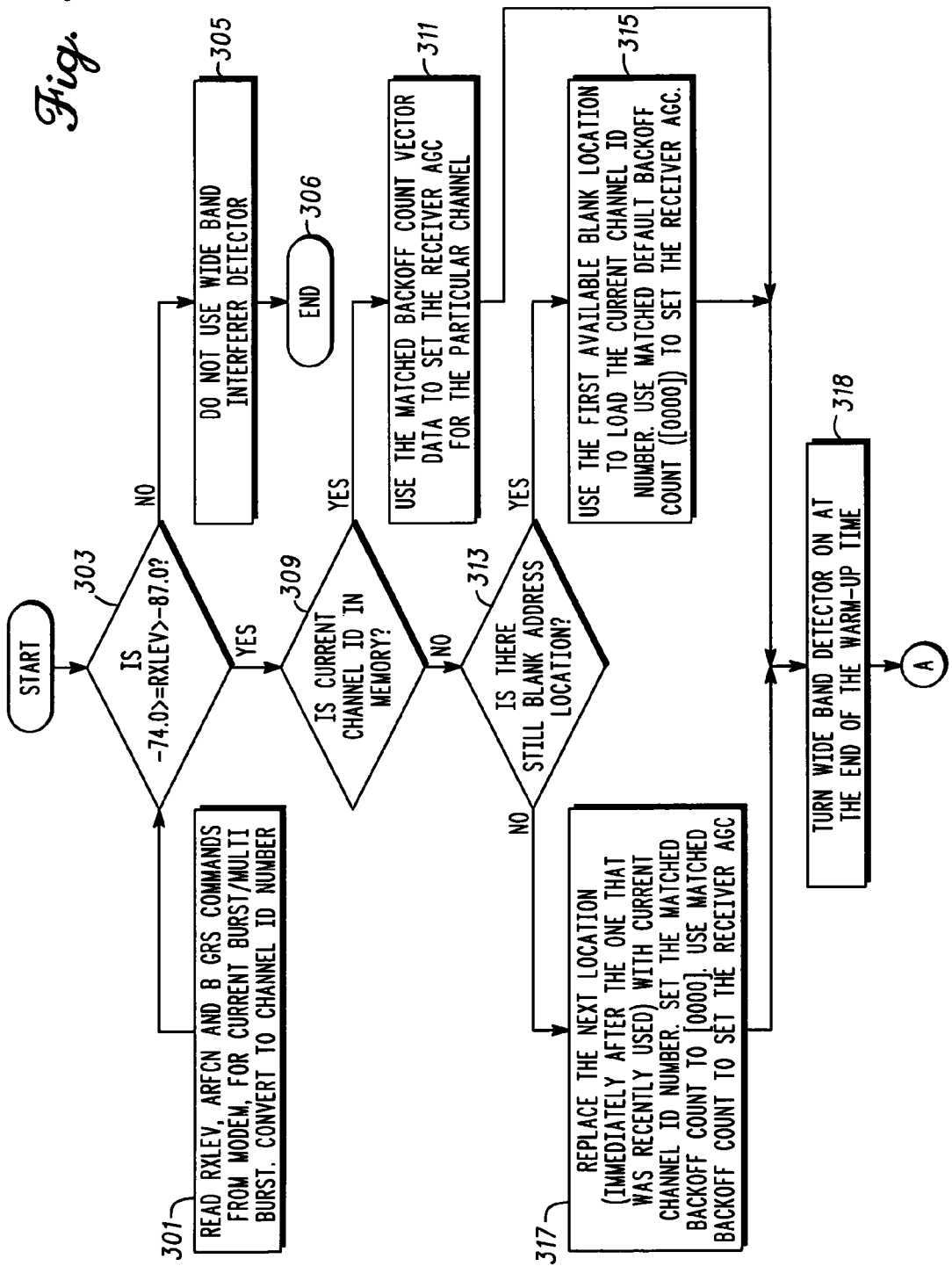

Fig. 6

AGC TABLE

| | SUB RANGE | DESIRED RF SIGNAL INPUT RANGE [dBm] | | RF AGC [dB] | IF AMP AGC [dB] | |
|---|---|---|---|---|---|---|
| | | FROM | TO | | SETTING 1 | SETTING 2 |
| | 1 | | −87.0 | 00.0 | 00.0 | 6.20 |
| BACKOFF 4 | 2_4 | >−87.0 | −84.0 | 00.0 | 00.0 | 6.20 |
| | 3_4 | >−84.0 | −74.0 | 00.0 | 00.0 | 6.20 |
| BACKOFF 3 | 2_3 | >−87.0 | −84.0 | 00.0 | 00.0 | 6.20 |
| | 3_3 | >−84.0 | −74.0 | 00.0 | 00.0 | 9.30 |
| BACKOFF 2 | 2_2 | >−87.0 | −84.0 | 00.0 | 00.0 | 9.30 |
| | 3_2 | >−84.0 | −74.0 | 00.0 | 3.10 | 12.40 |
| BACKOFF 1 | 2_1 | >−87.0 | −84.0 | 00.0 | 3.10 | 12.40 |
| | 3_1 | >−84.0 | −74.0 | 1.87 | 3.10 | 12.40 |
| DEFAULT | 2_0 | >−87.0 | −84.0 | 1.87 | 3.10 | 12.40 |
| | 3_0 | >−84.0 | −74.0 | 4.72 | 3.10 | 12.40 |
| | 4 | >−74.0 | −57.0 | 5.74 | 3.10 | 12.40 |
| | 5 | >−57.0 | −43.0 | 10.74 | 6.20 | 15.50 |
| | 6 | >−43.0 | −29.0 | 14.26 | 9.30 | 18.60 |
| | 7 | >−29.0 | −15.0 | 23.81 | 9.30 | 18.60 |

RECEIVER WITH AUTOMATIC GAIN CONTROL

FIELD OF THE INVENTION

This invention relates in general to communication equipment and more specifically to techniques and apparatus for improving signal to noise performance of receiver equipment.

BACKGROUND OF THE INVENTION

Communications equipment including receivers are known. Receivers typically operate to selectively receive a desired signal. The desired signal can be among a plethora of other signals, etc. that individually or collectively represent interferers or interfering signals. A receiver needs to receive or recover the desired signal in the presence of interfering signals and these signals can vary over many orders of magnitude in signal level. To help with the resultant dynamic range issues, receivers often employ automatic gain control systems where receiver gains are reduced as desired signal level increases.

Known AGC systems typically assess on-channel or desired signal levels and make gain adjustments accordingly. In some systems, e.g., second generation (2G) Global System for Mobile (GSM) systems, AGC systems make gain reductions assuming worst case interfering signals. This can result in receiver sensitivity or signal to noise degradation and thus increased error rates and the like.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 3 depicts a representative diagram of a flow chart showing one or more methods of increasing signal to noise in accordance with one or more embodiments;

FIG. 6 shows a table of AGC settings in accordance with one or more embodiments.

DETAILED DESCRIPTION

In overview, the present disclosure concerns AGC and receiver systems having or facilitating improved performance, e.g., improved signal to noise or sensitivity and corresponding methods thereof. It will be appreciated by those of ordinary skill that signal to noise may be referred to in terms of a ratio as in a signal to noise ratio. More particularly various inventive concepts and principles embodied in methods and apparatus, for establishing AGC settings and then adapting or adjusting or modifying these AGC settings will be discussed and disclosed.

The receivers and AGC systems of particular interest may vary widely but include various cellular phone receivers and other wireless receivers employing AGC. In systems, equipment and devices that employ AGC, apparatus and methods for adjusting the AGC can be particularly advantageously utilized, provided they are practiced in accordance with the inventive concepts and principles as taught herein.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like may be used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Figure 1:
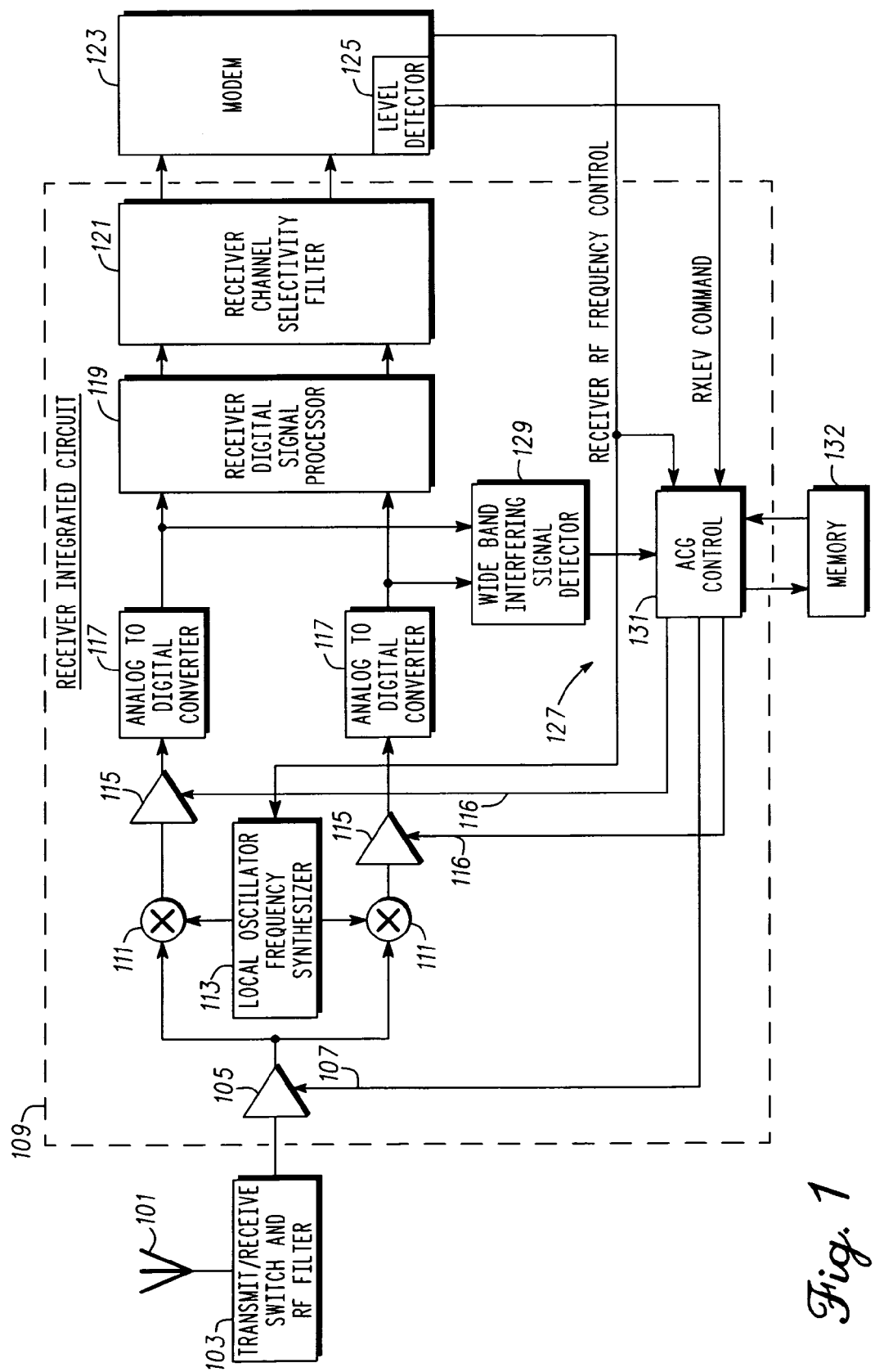
FIG. 1 depicts in a simplified and representative form, a high level diagram of a receiver system with an automatic gain control (AGC) system in accordance with one or more embodiments.

Referring to FIG. 1, a simplified and representative high level diagram of a receiver system with an automatic gain control (AGC) system in accordance with one or more embodiments will be briefly discussed and described. The receiver etc. of FIG. 1 in some embodiments can be or represent a Global System for Mobile (GSM) Enhanced Data Rate (EDGE) receiver. In FIG. 1, an antenna 101 is shown coupled to a transmit receive switch and basic radio frequency (RF) filtering (T/R switch) 103. The T/R switch 103 or signal is coupled to an RF amplifier 105 that has a variable gain where the gain is controlled or set by an AGC signal at 107. The RF amplifier is generally a low noise amplifier and may be referred to as a receiver front end amplifier. In some embodiments the RF amplifier 105 or variable gain amplifier along with other functional elements, as depicted, is part of a receiver integrated circuit 109. Radio frequency signals absorbed by the antenna 101 are coupled to the RF amplifier and amplified by an amount that is determined by the AGC setting as set by the AGC signal.

The RF amplifier 105 or signals there from are coupled to a complex mixer 111 (with in phase, I, and quadrature, Q, mixers) which down convert or frequency translate the signals from the RF amplifier to an intermediate frequency (IF). It is understood that I and Q may be used below to refer to the signal in the in phase path and Q to the signal in the quadrature path and that the I and Q signal will vary depending on what functions have been performed on the respective signals, i.e., depending on the location within the path that is being referred to. Generally the mixer 111 operates to down convert a desired or on channel signal frequency by an amount determined by a local oscillator frequency as established and provided by a frequency synthesizer 113. In some embodiments, the IF will be at or near zero hertz, i.e., the local oscillator frequency will be the same or very near to the channel frequency of the desired signal. The output signals, I and Q, from the mixer are coupled to a, respective, IF amplifier and filter 115. The IF amplifier has a variable gain, where the gain is set or determined or established by an AGC signal at 116. The filter is typically a low pass filter and operates to suppress high frequency noise and other extraneous mixing product signals or the like. Signals from the IF amplifier 115 are coupled to an analog to digital converter (ADC) 117 where they are converted to digital words.

The digital words from the ADC are coupled in some embodiments to a digital signal processor (DSP) 119, which can perform various functions such as channel compensation, frequency conversion to base band and the like, which are not germane to the present disclosure and thus will not be further discussed. The outputs from the DSP 119 are coupled to a receiver channel selectivity filter 121. This can be a digital filter, e.g., a finite impulse response (FIR) filter and generally operates to select the on-channel or desired signal and reject or reduce all other signals including adjacent or alternate or other off channel signals that may be represented in the signals from the DSP. In one embodiment the channel selectivity filter 121 is a $16^{th}$ order FIR, which is defined by up to 40 coefficients that are programmable as required.

The filter 121 and signals there from are coupled to a modem 123. The modem 123 is functionally dependent on the air interface which is being utilized. The modem generally operates on the in phase, I, and quadrature, Q, signals from the filter 121 to recover symbols. The modem is also responsible for controlling the frequency synthesizer 113 to control the frequency that the receiver is tuned to or operating on. This includes following a predetermined pattern whenever the receiver is operating a frequency hopping mode. The modem also and controls the basic timing associated with the receiver and other operating parameters as is known. Frequency hopping and the like is done in accordance with a predetermined frequency pattern, which is defined or the method by which it is determined is defined by the relevant air interface standards. Timing includes, e.g., timing associated with a time division multiple access (TDMA) protocol and each of these issues is well understood given a particular air interface protocol and thus, standard.

The modem in some embodiments also includes a signal level detector 125 while other embodiments use a separate signal level detector. In either case, the signal level detector 125 determines or obtains a signal strength that is based on or in accordance with a signal level for an on-channel or desired signal only. The signal level detector may take various forms with one form including a sum of squares operation, i.e., the signal level or amplitude is the square root of the sum of the in phase signal squared, $I^2$, plus the quadrature signal squared, $Q^2$. Note that the signal level may also be viewed as a signal power, which is the sum of the aforementioned squares, i.e., no need to find a square root. In one or more embodiments, the modem is arranged and constructed to facilitate operation is a TDMA air interface. In these situations the signal level detector assesses or determines the signal strength for a first burst or TDMA slot or frame and then uses the signal level for the first burst for a subsequent burst.

The signal level detector 125 is part of an automatic gain control (AGC) system 127, which is part of the receiver system of FIG. 1. Also included in the AGC system 127 is an interferer detector 129 (alternatively referred to as an interfering signal detector or a wideband signal detector) and a controller or AGC controller 131. The wideband or interferer detector is coupled to the I and Q outputs of the ADC 117 and operates to determine whether an interfering signal is present, i.e., in some embodiments determines or obtains a wideband signal strength or a signal strength based on a wideband signal, where the signal strength is indicative of an interfering signal being present in the wideband signal. It will be observed that the wideband signal in the FIG. 1 embodiment includes the desired or on-channel signal. This is not necessary but may be convenient or practical as additional filtering is not needed. The wideband signal detector 129 and the signal level detector 125 are coupled to the controller 131 and each can provide their respective information, i.e., indicating presence of an interferer or wideband signal strength or wideband signal level and signal level (RXLEV) to the controller. Again the interferer or wideband detector 129 can use a sum of the squares of the outputs from the ADCs and that information can be compared to a threshold in order to determine whether an interfering signal is present. Other embodiments of the wideband signal detector or wideband signal level detector can be coupled to the input of the ADC, provided they are arranged to operate with analog signals, etc.

The AGC controller 131 can be a general purpose controller or microprocessor or processor core that is executing appropriate software or firmware or a state machine or some combination of hardware, software, and the like. The software or other operating variables or parameters and results or the like can be stored in memory 132. The software, firmware, etc. will be evident to those of ordinary skill given the discussions and descriptions of the embodiments herein. The memory can be external too the receiver IC or part of the IC. The memory 132 can be electrically erasable read only memory or some other form of memory or some combination of forms of memory.

The automatic gain control (AGC) system 127 is arranged, adapted, and configured to increase signal to noise, specifically signal to noise of a desired signal at some point within the receiver as will become evident in view of the following discussions. As noted, in some embodiments, the AGC system 127 comprises or includes the signal level detector 125 for determining or obtaining a signal level (e.g., amplitude or power or the like) for a desired signal; the interfering or wideband signal detector for determining a wideband signal level that is indicative of whether an interfering signal is present, e.g., obtaining a second signal strength that is based on a wideband signal and is indicative of an interfering signal being present, the wideband signal including the desired signal; and further including the controller 131. The controller 131 in one or more embodiments is coupled to the signal level detector (signal level (RXLEV) of desired signal) and the wideband signal detector (wideband signal level) and configured and arranged to provide one or more AGC signals (see signals at 107, 116) to the receiver to establish a gain setting for the receiver, i.e., gain setting for the RF amplifier and IF amplifier. In doing so, an initial AGC setting for the receiver is based on the signal level and is established or set without regard to the wideband signal detector, etc. Then, the controller is further configured to adjust the initial AGC setting to provide an adjusted AGC setting for the receiver, e.g., if or whenever the interfering signal is not present or judged to not be present or is a lower level interferer.

The adjusted AGC setting typically increases the gain of the RF Amplifier 105 or IF Amplifier 115 or the gain they would have been set to if an interfering signal was present or was assumed to be present and doing the gain adjustment or increase will result is increasing the signal to noise at the output of the receiver in some ranges of desired signal level. Increase in signal to noise can result in lower error rates and better quality or higher data rate communications links. Thus, the controller can be further configured to adjust the initial AGC setting by providing the AGC signals such that the gain of one or more amplifiers in the receiver is increased, e.g., when the interfering signal is not present or is not too large. More specifically in some embodiments, as will be further described below, the controller is further configured to adjust the initial AGC setting by providing the AGC signals such that the gain of one or more amplifiers in the receiver is increased by an amount that depends on the wideband signal level, i.e., level of interfering signal. In some embodiments, the interfering or wideband signal detector is only operational or only utilized when the first signal strength is within a predetermined range, i.e., a range of desired signal where an adjusted AGC setting would yield an improved signal to noise or the like.

In embodiments of the AGC system that further comprise a memory, the controller can be coupled to the memory and configured to store the adjusted AGC setting in the memory indexed or along with a corresponding channel frequency or channel identifier (ID). Then, whenever the receiver is retuned to a channel or channel frequency corresponding to the desired signal and the AGC setting that was stored in memory, the controller can be configured for accessing the memory and applying the adjusted AGC setting to the receiver while it is tuned to that channel frequency. From FIG. 1 it is evident that a control line, e.g., RF frequency control line, from the modem to the frequency synthesizer is also coupled to the AGC controller 131. This insures that the controller can know or determine the frequency that the receiver is tuned to as and when required. Hence, when the receiver is a frequency hopping receiver or is operating in a frequency hopping mode, i.e., where the receiver is tuned to a multiplicity of channels or frequencies in accordance with a predetermined and known pattern, the controller is or can be configured such that a corresponding multiplicity of AGC settings are stored in the memory and respectively associated with the multiplicity of channels. Then as each channel or channel frequency is retuned to or accessed by the receiver, the corresponding AGC setting can be recalled and applied to the receiver.

Furthermore in some embodiments the controller is further configured to revert to the initial AGC setting at any time the interfering signal detector determines that the interfering signal is present. This allows the receiver to revert to appropriate gains in the present of an interfering signal. It will be appreciated that interfering signals will come and go as other communication links or paths are added or dropped by other receivers and transmitters. Furthermore, when the receiver is operating in a frequency hopped mode, it may experience interfering signals on some frequencies and not on others or at some times on some frequencies and not other times. As will be appreciated, this is the result of the pseudo random nature of the frequency hopping patterns for different transmitters and receivers that are sharing the same frequency band and resources. In some embodiments, the controller is further configured to progressively adjust the initial AGC setting with incremental adjustments occurring as the receiver is repetitively retuned to a channel corresponding to the desired signal and so long as an interfering signal is not present. In this manner the controller can make, e.g., a 6 dB adjustment in the AGC setting as a series of: three 2 dB adjustments; six 1 dB adjustments; a 3 dB, followed by a 2 dB, followed by a 1 dB adjustment for a total adjustment of 6 dB; etc. Various other patterns or progressions can be followed, where the patterns can be selected in view of the responsiveness of the AGC adjustments resulting from an interfering signal that is either newly discovered or has gone away.

Thus in summary, FIG. 1 shows a receiver system configured for improved signal to noise, the receiver system comprising, in one or more embodiments: a Global System for Mobile Enhanced Data Rate (EDGE) receiver including a plurality of variable gain amplifiers; a signal level detector for determining a signal level for a desired signal; a wideband signal detector for determining whether an interfering signal is present or how large the interfering signal may be; and a controller coupled to the signal level detector and the interfering signal detector and configured to provide an AGC signal to each of the plurality of variable gain amplifiers to establish a gain setting for the receiver, wherein an initial AGC setting for the receiver is based on the signal level, and wherein the controller is further configured to adjust the initial AGC setting to provide an adjusted AGC setting for the receiver, e.g., if the interfering signal is not present or is not large and if the signal level is within a predetermined range, the adjusted AGC setting increasing the signal to noise of the EDGE receiver.

The receiver system can further include or comprise a memory and wherein the EDGE receiver is operable to receive the desired signal in accordance with a frequency hopped protocol wherein an adjusted AGC setting corresponding to each of a plurality of frequencies is stored in the memory and used as the EDGE receiver is retuned to each of the plurality of frequencies. In various embodiments, the controller is or can be further configured to provide a final AGC setting for a given operating frequency of the receiver by progressively adjusting, as the receiver is repetitively tuned to the given operating frequency, a present AGC setting through a series of adjustments to provide the final AGC setting.

Figure 2:
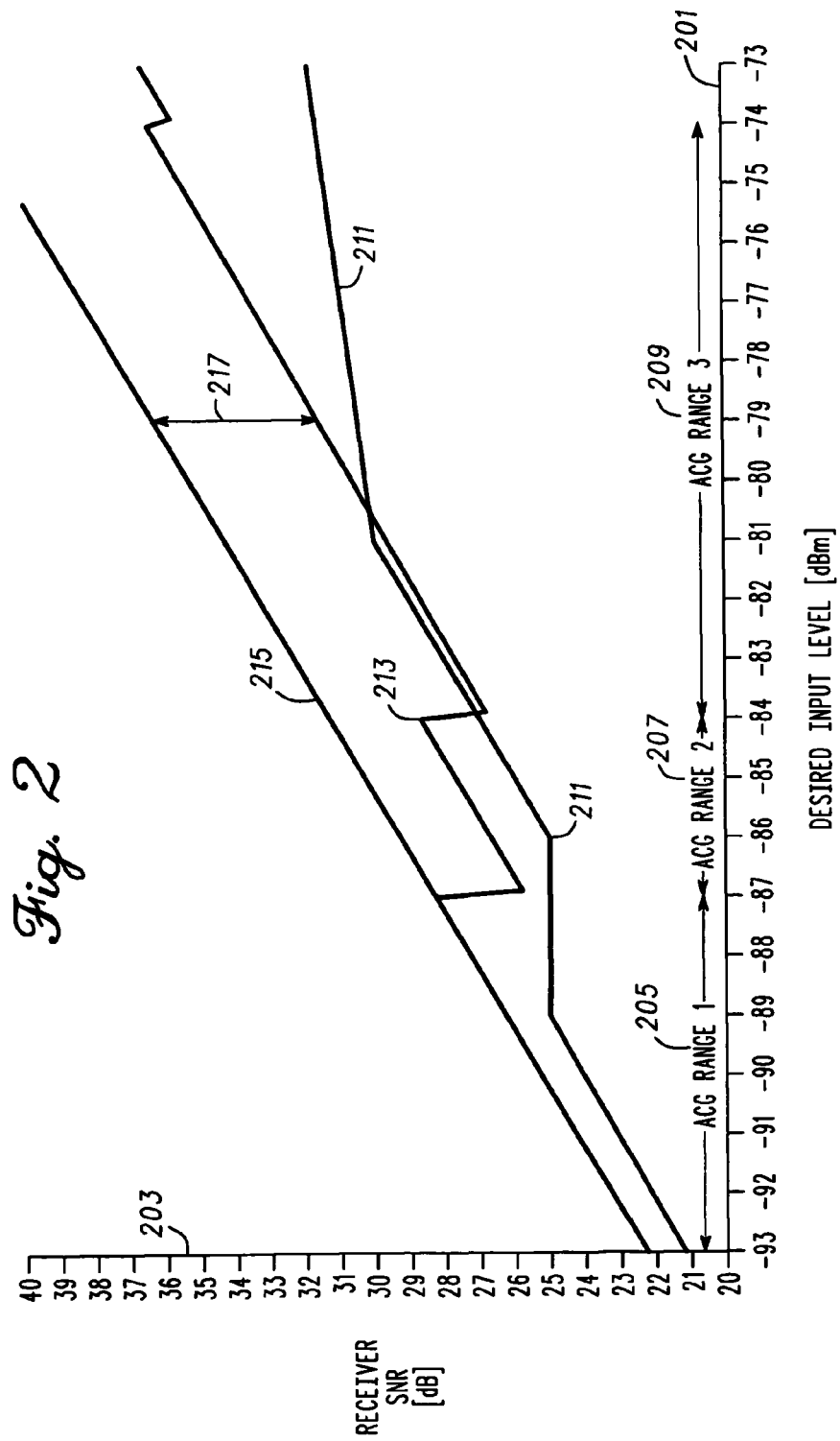
FIG. 2 in a representative form, shows a diagram that illustrates signal to noise loss due to an AGC setting in accordance with one or more embodiments.

Referring to FIG. 2, a representative diagram that illustrates signal to noise loss due to AGC setting in accordance with one or more embodiments will be briefly discussed and described. FIG. 2 shows a input level of a desired signal 201 or on channel signal on the horizontal axis and signal to noise 203 on the vertical axis. The input signal level or desired signal level is shown separated into 3 ranges; range 1 205, range 2 207, and range 3 209. FIG. 2 shows a required signal to noise 211 and various break points as depicted. It will be appreciated that signal to noise or signal to noise ratio refers to the signal level divided by the noise level. The signal to noise level reflected in FIG. 2 is the signal to noise level where the noise is generally white Gaussian noise that is contributed by one or more of the functional elements of the receiver, e.g., RF amplifier, mixer, IF amplifier, and the like.

Additionally depicted, is a signal to noise plot 213 for one receiver embodiment, wherein the AGC setting or attenuation is performed in accordance with a presumption that a worst case interfering signal is present, i.e., the maximum amount of gain reduction is applied. The maximum amount of gain reduction is applied to be certain that the interfering signal or interferer does not result in overloading (blocking) one or more stages (typically the RF amplifier, or analog to digital converters are the most sensitive to interferers) in the receiver. For this reason the interferers are sometimes referred to as blockers or blocking signals. As shown the signal to noise takes various steps as the ranges change with the signal to noise actually falling below the required signal to noise over the input or desired signal level range of −84 to −80.5 and with signal to noise degradations for input levels exceeding −87 dBm. Further shown is a curve of signal to noise without AGC cutbacks 215 and it is observed that as much as 4.5 dB loss or reduction 217 in signal to noise occurs due to AGC settings that assume worst case interferer signal levels. One or more embodiments herein seek to approach the signal to noise curve without AGC cutbacks 215 as long as actual interfering signal levels allow for it.

Referring to FIG. 3, a representative diagram of a flow chart showing one or more methods of increasing signal to noise in a receiver in accordance with one or more embodiments will be discussed and described. The FIG. 3 flow chart begins with receiver warm up. It is understood that the receiver or AGC system has gone through a cold start, i.e., the receiver has been enabled and any AGC adjustments have been set to "0" and any channel frequency or channel identifiers have been zeroed out in memory. After the cold start, in one or more embodiments, the receiver will operate in accordance with GSM EDGE second generation protocols wherein information is transmitted over the channel or air interface in bursts. Each burst is comprised of a 28 micro second warm up or start up period followed by 543 micro seconds of data and then a 28 micro second turn off time or period. Eight bursts are included in each frame and usually a receiver is assigned a burst although sometimes as is known a receiver will be assigned multiple bursts or slots within a frame. A receiver will receive a multiplicity of bursts over successive frames. Each of the bursts will be on an assigned channel frequency. If the receiver is operating in a hopping mode the actual frequency for each frame or burst may vary in a predetermined manner or in accordance with a known pattern. Thus the receiver, e.g., AGC controller, etc. during a warm up time for a burst will read 301 the signal level of the desired signal (RXLEV) along with channel frequency (converted to channel ID) and other GRS information/commands, which are provided by the modem. The method starts with obtaining a signal strength that is based on a signal level for a desired signal, i.e., RXLEV. As noted earlier RXLEV is often obtained or determined during a given burst and applied or used in the immediately subsequent burst.

As shown the RXLEV or signal level for the desired signal is tested to see whether it lies within a predetermined range 303. If not, the wideband or interferer detector is not utilized or enabled 305 and the AGC is set in accordance with the signal level of the desired signal (see FIG. 6) and the method waits for the next frame 306, i.e., starts again at the next frame. If the signal level is within the predetermined or known range (−74 to −87 dBm), the wideband or interfering signal detector is turned on at the end of the warm up period (28 micro seconds into a burst) (see 318). A check is also performed to determine whether the present channel ID (from 301) is in the memory 309. If the channel does exist in memory the present AGC backoff count or vector from memory is used to set the receiver AGC for this particular channel frequency or ID and frame 311.

The AGC backoff vector in one or more embodiments is a 4 bit portion of a data vector along with a 10 bit channel ID field that is used to store information in the memory. The 4 bit portion allows one of as many as 16 AGC backoff counts to be specified. In one embodiment 5 backoff values have been defined and thus a given backoff count or vector will be translated or mapped into backoff values 0, 1, 2, 3, or 4, with 0 representing no backoff and 4 representing the maximum amount of AGC backoff. An AGC backoff count between 0-15 is defined as or is mapped to one of 5 AGC backoff values (where each AGC backoff value defines an AGC setting for the RF amplifier and IF amplifier) as follows:
backoff count of 0-7 is a backoff value of 0'
backoff count of 8-9 is a backoff value of 1;
backoff count of 10-11 is a backoff value of 2;
backoff count of 12-13 is a backoff value of 3; and
backoff count of 14-15 is a backoff value of 4.

By using the counts from 0-15 or the like, a practitioner can set an amount of delay that will be experienced prior to AGC backoffs being applied or the relative aggressiveness of AGC backoffs or reassertions of the initial AGC values, i.e., 0-3 rather than 0-7 would represent less delay and so forth. These concepts will become evident with the discussions of FIGS. 4A and 4B below.

As illustrated in FIG. 6, the AGC backoff is a function of the signal level of the desired or on channel signal. For example, Backoff 1 601 specifies different RF AGC 603 settings for signal levels between −87 and −84 dBm versus −84 and −74 dBm, respectively, 0.0 dB versus 1.87 dB. Each of the backoffs 0 through 4 define AGC settings for at least two levels of the desired signal. FIG. 6 also illustrates different settings (setting 1 605 and setting 2 607) for IF AGC, where these settings can represent varying gains or tolerances in an integrated circuit embodiment. Additional settings can be defined as needed.

Backoff or AGC backoff as used herein means that the AGC setting (amount of gain reduction) for the RF amplifier or IF amplifier is backed off or reduced (gain reduction is less and thus gains are more) from the AGC setting that would be used if a worst case interferer were present or assumed to be present. As one example, at −87 dBm the AGC indicated for a worst case interferer shows a reduction of approximately 8 dB of gain with approximately 2 dB reduction from the RF amplifier and 6 dB from the IF amplifier. See FIG. 6, Default or Backoff 0 609 and corresponding gain reductions or AGC settings for the RF AGC 603 and IF AGC, setting 2 607 as compared to the same for a signal level less than −87 dBm (sub range 1, 611). If there is no interferer or if the interferer is not overly large there may be no need for any gain reduction at this desired signal level and thus the AGC backoff in this example would be approximately 2 dB (1.87 dB compare values at 603)) for the RF amplifier and approximately 6 dB (12.4−6.2 dB, compare values at 607) for the IF amplifier. It will be appreciated that experimentation by one of rudimentary skill can be utilized to appropriately define the backoff values or settings and distribution between the RF amplifier and IF amplifier so as to provide the optimum signal to noise improvements and interferer protection for a given receiver embodiment, etc. As was noted above, one or more embodiments of the receiver system of FIG. 1 is as an integrated circuit. It will be appreciated that the appropriate backoff value or setting can also vary with process or fabrication tolerances and the like and thus may be used to compensate for process tolerances (see, e.g., 606, 607).

Referring again to FIG. 3, if the channel ID is not in memory, it is determined whether there is any space in memory 313. If there is space, the first available blank memory location is used and loaded with the present channel ID and a default backoff count (0000) 315, which means no AGC adjustment or backoff is made and thus only the signal level, RXLEV, is utilized to set the AGC levels for the receiver, i.e., in accordance with FIG. 6. If no space is available, a space is selected in memory and overwritten with the present channel ID and the default backoff count or vector (0000) and this count is used to set the receiver AGC 317. One may choose to overwrite the last memory location that was recently used or the oldest unused slot or some other selection criteria. It should be noted that after 311, 315, or 317, the wideband detector is enabled after the warm up time 318 and is disabled at the end of the data time period, i.e., 28 plus 543 micro seconds into a burst, for the present burst and an output sample (wideband signal level) is provided 319 (see FIG. 4A), where this sample is denoted P_ADC_dBm_ave. This sample or wideband signal level is tested and used as will be explained with reference to FIG. 4.

Figure 4A:
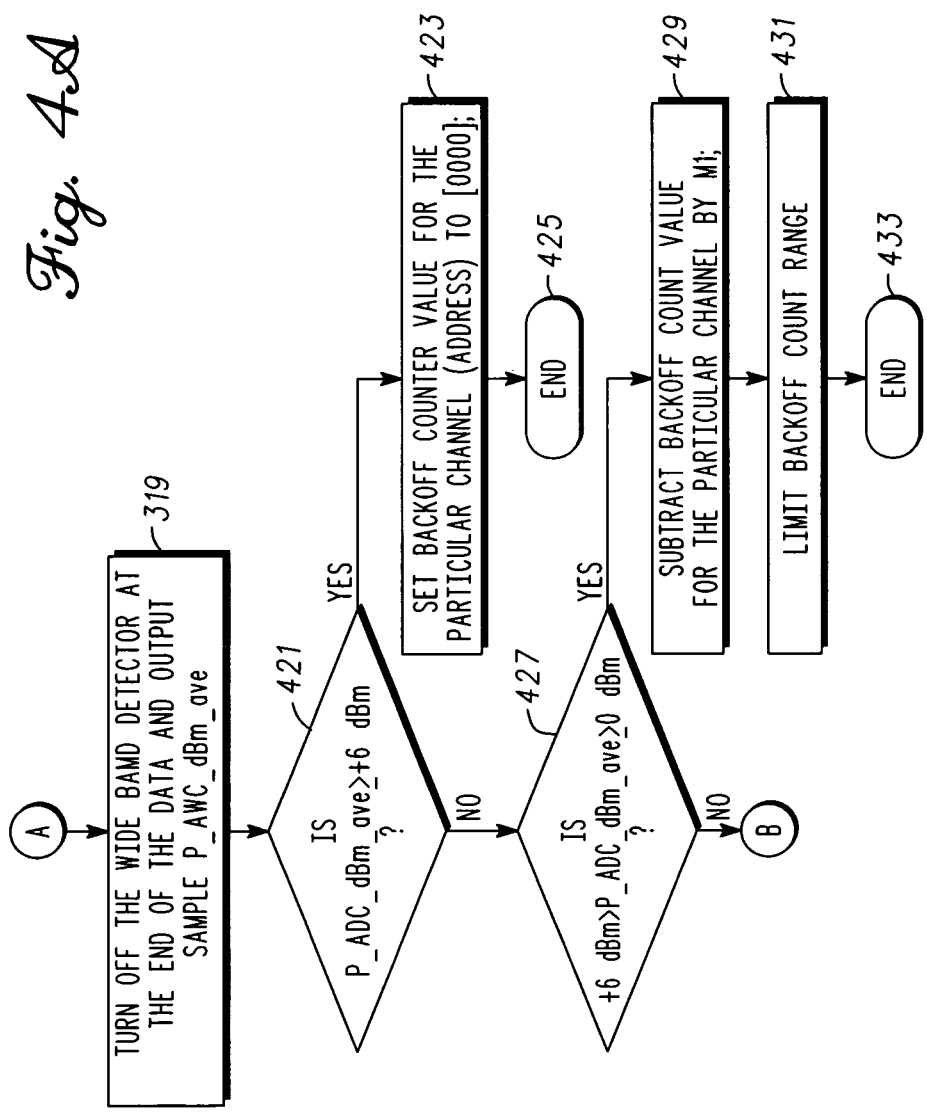
FIG. 4A and FIG. 4B depicts a representative diagram of a flow chart which is an extension of or is used together with FIG. 3 showing one or more methods of adjusting AGC in a receiver in accordance with one or more embodiments.
Figure 4B:
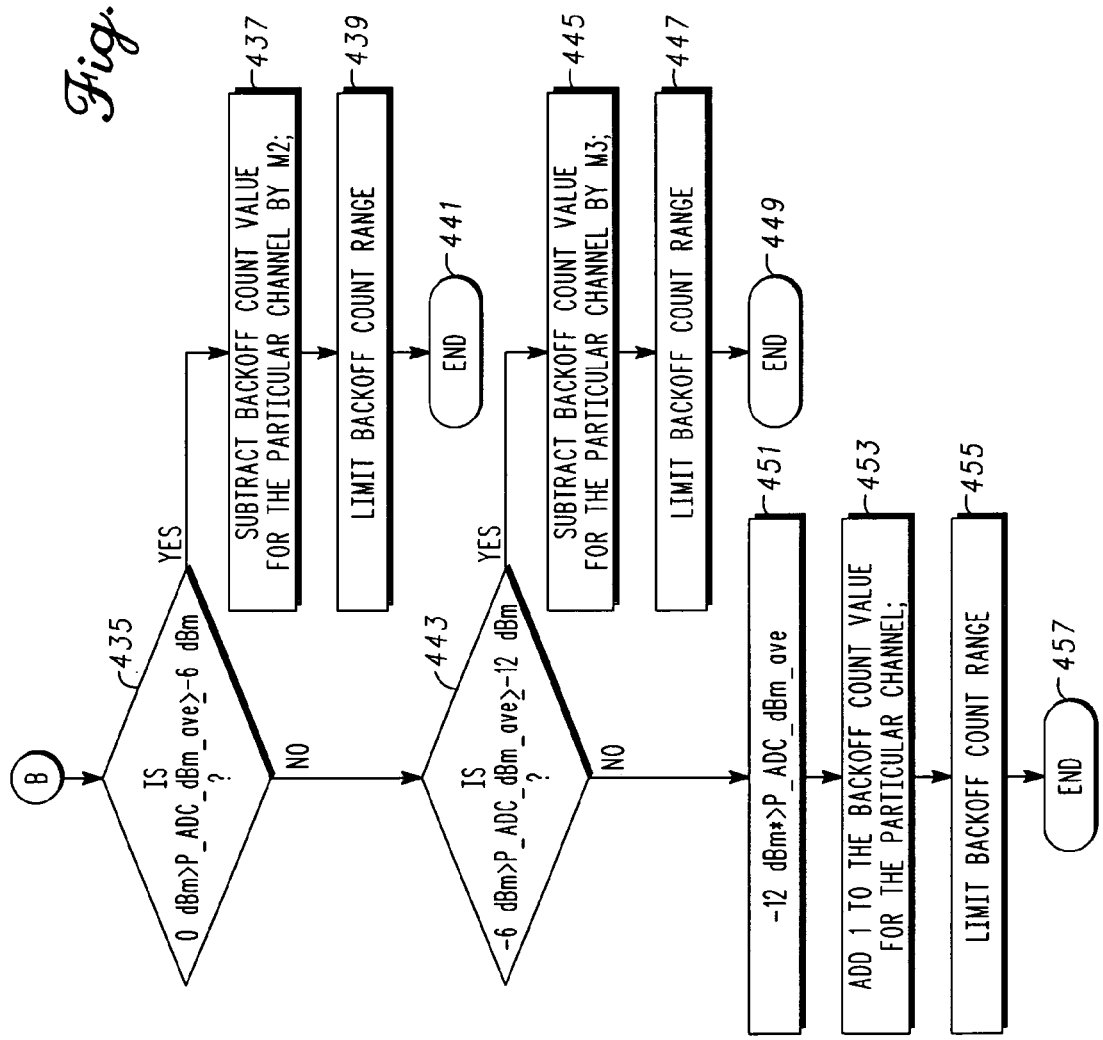

Referring to FIG. 4A and FIG. 4B (collectively referred to as FIG. 4), a representative diagram of a flow chart showing one or more methods of increasing signal to noise by adjusting AGC in a receiver in accordance with one or more embodiments will be discussed and described. FIG. 4 illustrates one embodiment of how the backoff count or vector is changed given the P_ADC_dBm_ave from 319. It will be appreciated that the backoff is changed only after a given slot or slots or frame and thus will impact the next slot or frame, if at all. The particular dB levels shown in FIG. 4 were selected based on an ADC clipping value at the input of +10 dBm and these values are referenced to the input of the ADC. Basically FIG. 4 shows determining a range for the wideband signal level and then taking varying actions based on that determination.

The method of FIG. 4 starts by determining whether P_ADC_dBm_ave exceeds +6 dBin 421. If so this is quite likely the result of a strong interfering signal and 423 shows setting the backoff count or vector to (0000) and waiting for the next frame 425, i.e., "0" backoff and the AGC setting is determined from the desired signal level only, which essentially assumes a worst case interfering signal. Thus the method shows reverting to the initial AGC setting at any time the interfering signal is present or clearly present. If 421 is "NO", the method determines whether P_ADC_dBm_ave is within the +6 dBm to 0 dBm range 427 and if so the backoff count is reduced by M1 429 for the particular channel with the resultant backoff count limited to 0-15 431 as appropriate and the next frame is awaited wherein the newly formed backoff count will be used as appropriate. M1 is a programmable value with some embodiments using a default value of 3.

If the result of 427 is "NO", the method determines whether P_ADC_dBm_ave is between 0 dBm and −6 dBm 435 and if so the backoff count is reduced by M2 437 for the particular channel with the resultant count limited 439 as appropriate and the next frame is awaited 441. M2 is selectable in one embodiment with a default value equal to 2. If the result of 435 is "NO", the method determines whether P_ADC_dBm_ave is between −6 dBm and −12 dBm 443 and if so the backoff count is reduced by M3 445 for the particular channel with the resultant count limited 447 as appropriate and the next frame is awaited 449. M1 is selectable in one embodiment with a default value equal to 1. If the result of 443 is "NO", the method knows that P_ADC_dBm_ave is less that −12 dBm 443 and the backoff count is increased by "1" 453 for the particular channel with the resultant count limited 455 as appropriate and the next frame is awaited 457. If an increase rate that is greater than 1 is preferred it can be used although that will increase the rate of backing off from the AGC setting that is based on desired signal level. FIG. 3 and FIG. 4 are repeated for each frame and generally the information collected during one frame is used to set the AGC for the following frame. It will be appreciated that by selecting the counts that are translated to AGC backoff values as well as step sizes M3, M2, M1, etc., the relative responsiveness of the AGC system can be tailored or selected as desired. Larger step sizes (M3, M2, M1) suggest the AGC backoff count will be reduced faster (gains are reduced faster) for a give wideband signal level. A larger backoff count prior to an initial AGC backoff (or gain increase) will add delay before a gain increase after the wideband signal disappears, etc.

Thus FIG. 3 and FIG. 4 have illustrated one or more embodiments of a method for increasing signal to noise in a receiver wherein the method can be performed by the apparatus illustrated in FIG. 1 or other appropriately arranged and configured apparatus. As a review the methods include obtaining a first signal strength that is based on a signal level for a desired signal 301, establishing an initial automatic gain control (AGC) setting for the receiver based on the first signal strength 311, 315, 317 (show 0 backoff); obtaining a second signal strength, P_ADC_dBm_ave, 307, 319 that is based on a wideband signal and is indicative of an interfering signal being present, the wideband signal including the desired signal; and adjusting the initial AGC setting based on the second signal strength to provide an adjusted AGC setting for the receiver, thereby increasing the signal to noise. FIG. 4 adjusts the backoff counts which are used to establish the AGC settings or signals for subsequent frames or bursts.

In some embodiments, the adjusting the initial AGC setting further comprises cutting back the amount of AGC and thus increasing a receiver gain when the interfering signal is not present, see e.g. 453 where backoff count is increased thereby reducing the amount of AGC and increasing receiver gains when the interfering signal is not present or if present very small. As is evident from the FIG. 4 discussions, the adjusting the initial AGC setting further comprises cutting back the amount of AGC by an amount that depends on the second signal level for the wideband signal. Furthermore, in some embodiments obtaining the second signal strength is responsive to the first signal strength and the obtaining a second signal strength is only undertaken when the first signal strength is within a predetermined range, e.g., RXLEV is within a range 303, 305.

The method in some embodiments comprises identifying a channel for the desired signal 301 and storing the adjusted AGC setting FIG. 4 and the channel in a memory 315, 317 and whenever the receiver is retuned to the channel, accessing the memory and applying the adjusted AGC setting to the receiver 311. When the receiver is a frequency hopping receiver that is tuned to a multiplicity of channels and a corresponding multiplicity of AGC settings are respectively stored together with the multiplicity of channels as indicated via FIG. 3 along with FIG. 4 repetitively applied. The method of these FIGs comprises progressively adjusting the initial AGC setting with incremental adjustments occurring as the receiver is repetitively retuned to a channel or channel frequency as discussed above with reference to FIG. 3 and FIG. 4.

The AGC system and corresponding methods discussed above can use a controller that is further configured to progressively adjust a backoff count as the receiver is repetitively retuned to a channel and use the backoff count to determine each of the incremental adjustments, wherein a given incremental adjustment is determined for a first or current tuning or trip to the channel and is applied to provide the adjusted AGC setting for a subsequent tuning or trip to the channel. The AGC system of claim 18 wherein the controller is further configured to progressively adjust the backoff count by a step size that depends on the wideband signal level with a large wideband signal level (indicating large interferer) resulting in a large step size for reducing the backoff count and correspondingly the gain settings, i.e., increasing the AGC settings. Similarly a smaller wideband signal results in smaller stepped reductions used or when a very small wideband signal is present the backoff counts can be increased.

Figure 5:
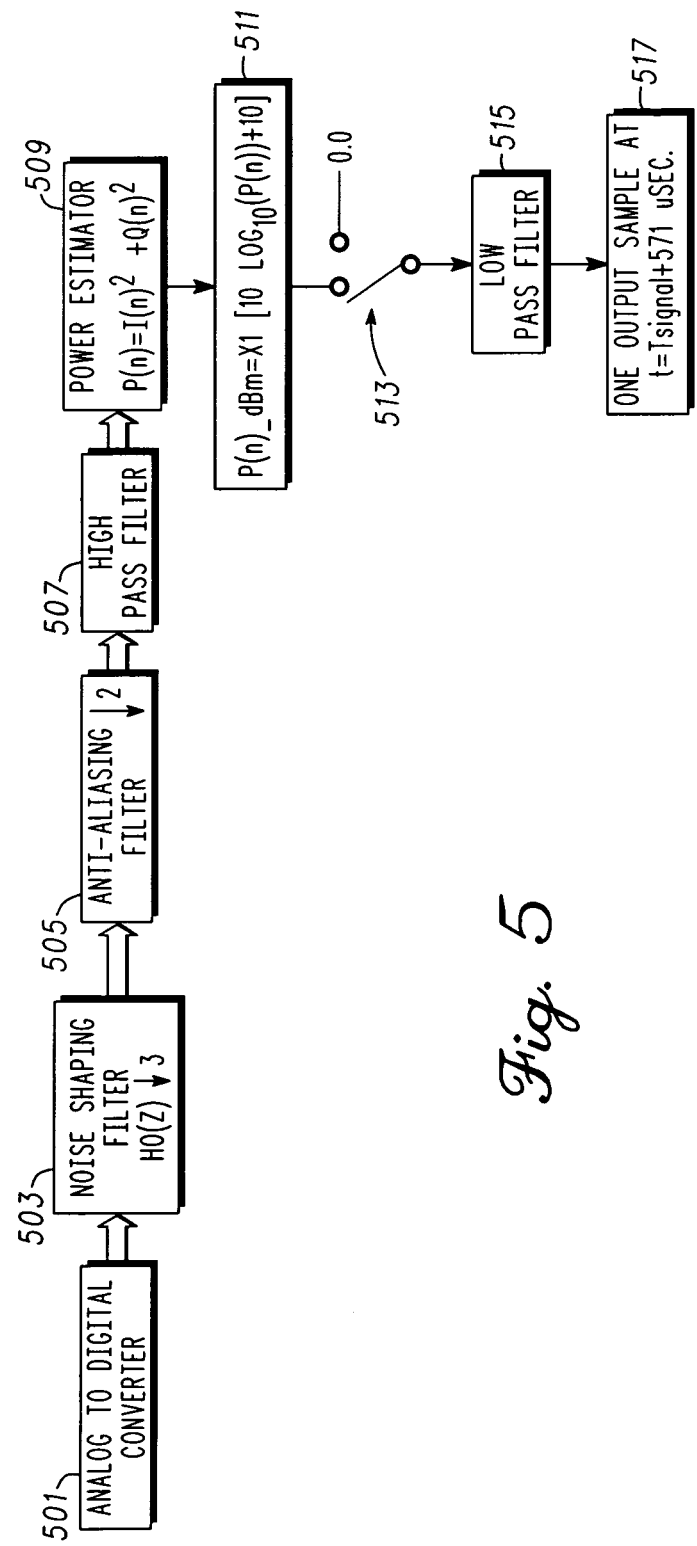
FIG. 5 depicts a representative block diagram of a wideband signal level detector in accordance with one or more embodiments.

Referring to FIG. 5, a representative block diagram of a wideband signal level detector in accordance with one or more embodiments will be briefly discussed and described. FIG. 5 illustrates one embodiment of a wideband signal detector with various functions all intercoupled as depicted. FIG. 5 shows an ADC 104 (see e.g., 117) operating at a sampling rate of 104 MHz with an output coupled to an integrator and down sampler 503, which selects every $3^{rd}$ sample and provides samples at 34.667 MHz. These are applied to a further down sampler (by 2) and low pass filter (often referred to as a half band filter) 505, which provides filtered samples at 17.333 MHz. The filtered samples are coupled to a high pass filter 507, which operates to reduce low frequency components and enhance higher frequency components of its input. The high pass filter is coupled to a power estimator 509 which forms a sum of squares of the in phase and quadrature components at its input. This power estimate is converted to dBm at dB convertor 511. The dBm convertor uses the formula shown, where X1 is a constant that can be used for calibration purposes such that a known signal level provides a known output level from the wideband signal or signal level detector. The output of the dBm convertor is shown as coupled to switch 513. The switch is used to illustrate that the wideband signal detector is enabled after the warm up time period, i.e., 28 micro seconds into a burst. The output of the switch is coupled to a low pass filter 515, which averages the output from the switch over the 543 micro second data time. One sample is provided at 28+543=571 micro seconds after the beginning of a burst Tsignal where this sample is denoted as P_ADC_dBm_ave in FIGS. 3 and 4.

The processes, apparatus, and systems, discussed above, and the inventive principles thereof are intended to and can alleviate reduced signal to noise issues caused by prior art techniques. Using these principles of reducing the amount of AGC that is used given an assumption of a worst case interferer can quickly yield an accurate and appropriate AGC setting with relatively minimal costs and the like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of increasing signal to noise ratio in a receiver, the method comprising:
   obtaining a first signal strength that is indicative of and based on a signal level for a desired signal;
   establishing an initial automatic gain control (AGC) setting for the receiver based on the first signal strength;
   obtaining a second signal strength that is based on a wideband signal and is indicative of a level of the wideband signal and indicative of an interfering signal being present, the wideband signal including the desired signal, the initial AGC setting is independent from the second signal strength as obtained; and
   adjusting the initial AGC setting based on the second signal strength to provide an adjusted AGC setting for the receiver, the adjusted AGC setting will increase the signal to noise ratio of the desired signal relative to the signal to noise ratio resulting from the initial AGC setting.

2. The method of claim 1 wherein the adjusting the initial AGC setting further comprises cutting back the amount of AGC and thus increasing a receiver gain when the interfering signal is not present.

3. The method of claim 1 wherein the adjusting the initial AGC setting based on the second signal strength to provide an adjusted AGC setting for the receiver further comprises cutting back the amount of AGC by an amount that depends on the second signal strength for the wideband signal.

4. The method of claim 1 wherein the obtaining the second signal strength is responsive to the first signal strength.

5. The method of claim 4 wherein the obtaining the second signal strength is only undertaken when the first signal strength is within a predetermined range.

6. The method of claim 1 further comprising identifying a channel for the desired signal and storing the adjusted AGC setting and the channel in a memory and thereafter whenever the receiver is tuned to another channel and then is retuned to the channel, accessing the memory and applying the adjusted AGC setting to the receiver.

7. The method of claim 6 wherein the receiver is a frequency hopping receiver that is tuned to a multiplicity of channels and wherein a corresponding multiplicity of AGC settings are respectively stored together with the multiplicity of channels.

8. The method of claim 6 further comprising reverting to the initial AGC setting at any time the interfering signal is present.

9. The method of claim 6 further comprising progressively adjusting the initial AGC setting with incremental adjustments occurring as the receiver is repetitively retuned to the channel.

10. An automatic gain control (AGC) system configured to increase signal to noise ratio in a receiver, the AGC system comprising:
    a signal level detector for determining a signal level for a desired signal;
    a wideband signal detector for determining a wideband signal level of a wideband signal, the wideband signal including the desired signal and being indicative of an interfering signal being present; and
    a controller coupled to the signal level detector and the wideband signal detector and configured to provide one or more AGC signals to the receiver to establish a gain setting for the receiver, wherein an initial AGC setting for the receiver is based on the signal level and independent from the wide band signal level, the controller further configured to adjust the initial AGC setting based on the wideband signal level to provide an adjusted AGC setting for the receiver, the adjusted AGC setting increasing the signal to noise ratio for the desired signal relative to the signal to noise ratio resulting from the initial AGC setting.

11. The AGC system of claim 10 wherein the controller is further configured to adjust the initial AGC setting by providing the AGC signals such that the gain of one or more amplifiers in the receiver is increased when the interfering signal is not present.

12. The AGC system of claim 10 wherein the controller is further configured to adjust the initial AGC setting based on the wideband signal level to provide an adjusted AGC setting for the receiver by providing the one or more AGC signals such that the gain of one or more amplifiers in the receiver is increased by an amount that depends on the wideband signal level.

13. The AGC system of claim 10 wherein the wideband signal detector is only operational when the signal strength is within a predetermined range.

14. The AGC system of claim 10 further comprising a memory and wherein the controller is coupled to the memory and configured to store the adjusted AGC setting in the memory and whenever the receiver is retuned to a channel corresponding to the desired signal, accessing the memory and applying the adjusted AGC setting to the receiver.

15. The AGC system of claim 14 wherein the receiver is a frequency hopping receiver that is tuned to a multiplicity of channels and wherein the controller is configured such that a corresponding multiplicity of AGC settings are stored in the memory and respectively associated with the multiplicity of channels.

16. The AGC system of claim 14 wherein the controller is further configured to revert to the initial AGC setting at any time the interfering signal detector determines that the interfering signal is present.

17. The AGC system of claim 10 wherein the controller is further configured to progressively adjust the initial AGC setting with incremental adjustments occurring as the receiver is repetitively retuned to a channel corresponding to the desired signal.

18. The AGC system of claim 17 wherein the controller is further configured to progressively adjust a backoff count as the receiver is repetitively retuned to a channel and use the backoff count to determine each of the incremental adjustments, wherein a given incremental adjustment is determined for a first tuning to the channel and is applied to provide the adjusted AGC setting for a subsequent tuning to the channel.

19. The AGC system of claim 18 wherein the controller is further configured to progressively adjust the backoff count by a step size that depends on the wideband signal level.

20. A receiver system configured for improved signal to noise ratio comprising:
   a Global System for Mobile Enhanced Data Rate (EDGE) receiver including a plurality of variable gain amplifiers;
   a signal level detector for determining a signal level for a desired signal;
   a wideband signal detector for determining a wideband signal level that is indicative of whether an interfering signal is present; and
   a controller coupled to the signal level detector and the wideband signal detector and configured to provide an AGC signal to each of the plurality of variable gain amplifiers to establish a gain setting for the receiver, wherein an initial AGC setting for the receiver is based on the signal level and is independent from the wideband signal level, and wherein the controller is further configured to adjust the initial AGC setting to provide an adjusted AGC setting for the receiver based on the wideband signal level if the signal level is within a predetermined range, the adjusted AGC setting increasing the signal to noise ratio for the desired signal relative to the signal to noise ratio resulting from the initial AGC setting in the EDGE receiver.

21. The receiver system of claim 20 further comprising a memory and wherein the EDGE receiver is operable to receive the desired signal in accordance with a frequency hopped protocol wherein an adjusted AGC setting corresponding to each of a plurality of frequencies is stored in the memory and used as the EDGE receiver is retuned to each of the plurality of frequencies.

22. The receiver system of claim 20 wherein the controller is further configured to provide a final AGC setting for a given operating frequency of the receiver by progressively adjusting, as the receiver is repetitively tuned to one or more other operating frequencies and then retuned to the given operating frequency, a present AGC setting through a series of adjustments to provide the final AGC setting.

* * * * *